United States Patent [19]

Tanaka et al.

[11] Patent Number: 4,827,209
[45] Date of Patent: May 2, 1989

[54] INSTRUMENT WITH CROSSED-COIL TYPE MOVABLE MAGNET

[75] Inventors: Seizou Tanaka; Ryuichi Ando, both of Nagaoka, Japan

[73] Assignee: Nippon Seiki Co., Ltd., Nagaoka, Japan

[21] Appl. No.: 76,842

[22] Filed: Jul. 23, 1987

[30] Foreign Application Priority Data

Jul. 31, 1986 [JP] Japan .................................. 61-180920

[51] Int. Cl.4 .......................... G01R 11/30; G01P 3/48
[52] U.S. Cl. ..................................... 324/143; 324/167; 324/115
[58] Field of Search .................... 324/143, 146, 140 R, 324/140 D, 111, 115, 166, 167, 168

[56] References Cited
U.S. PATENT DOCUMENTS 4,230,984  10/1980  Taylor .............................. 324/140 R Primary Examiner—Reinhard J. Eisenzopf
Assistant Examiner—Anthony L. Miele
Attorney, Agent, or Firm—Lowe, Price, LeBlanc, Becker & Shur

[57] ABSTRACT

An instrument has a crossed-coil-type movable magnet in which a movable magnet rotatable about the shaft of a pointer needle is installed in a crossed coil unit and a measured quantity or the like is operated by supplying electric power to the crossed coil unit. The instrument includes an input unit to receive an input from a measurement object to be measured, an arithmetic section or ROM to set directions and time values for supplying electric current to the coils of the crossed coil unit, and a circuit section to deliver pulse signals with predetermined potential values to the crossed coils under conditions associated with the directions and time values, to provide a very broad angular range of the pointer needle.

6 Claims, 7 Drawing Sheets

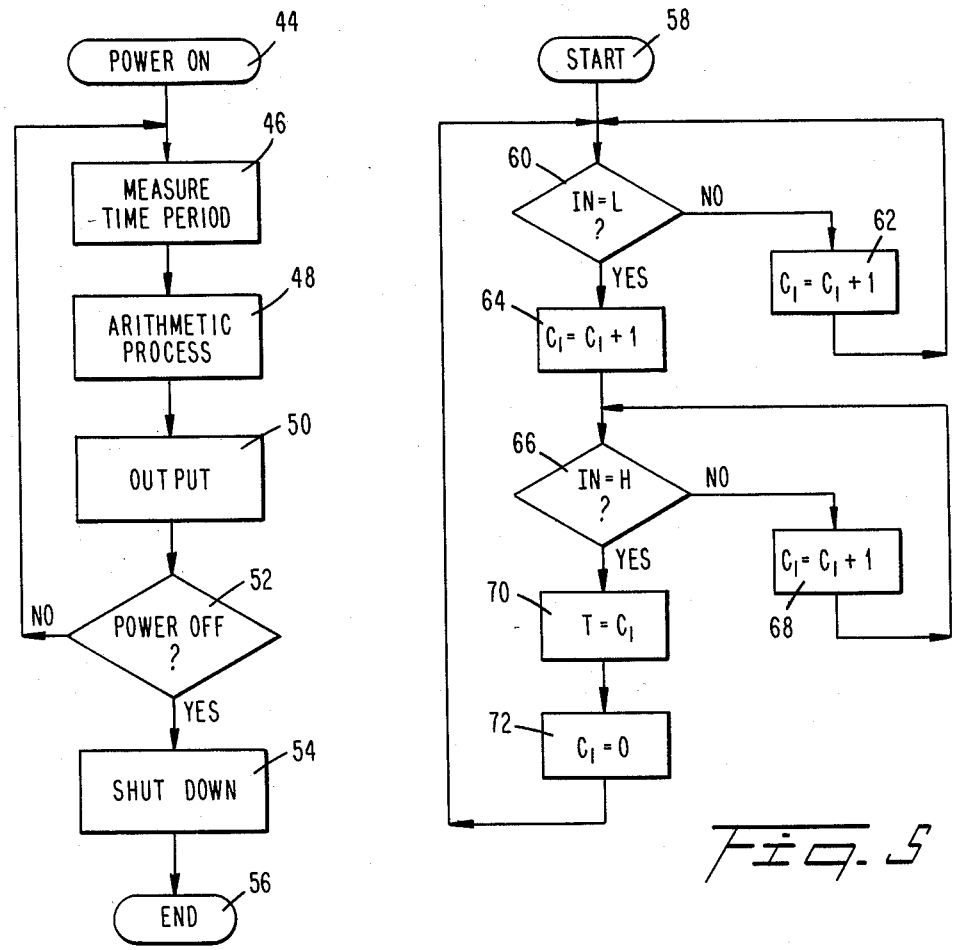
Fig. 4
Fig. 5
Fig. 6a  INPUT PULSE
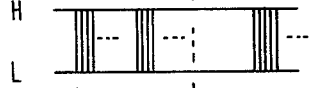
Fig. 6b  CLOCK PULSE

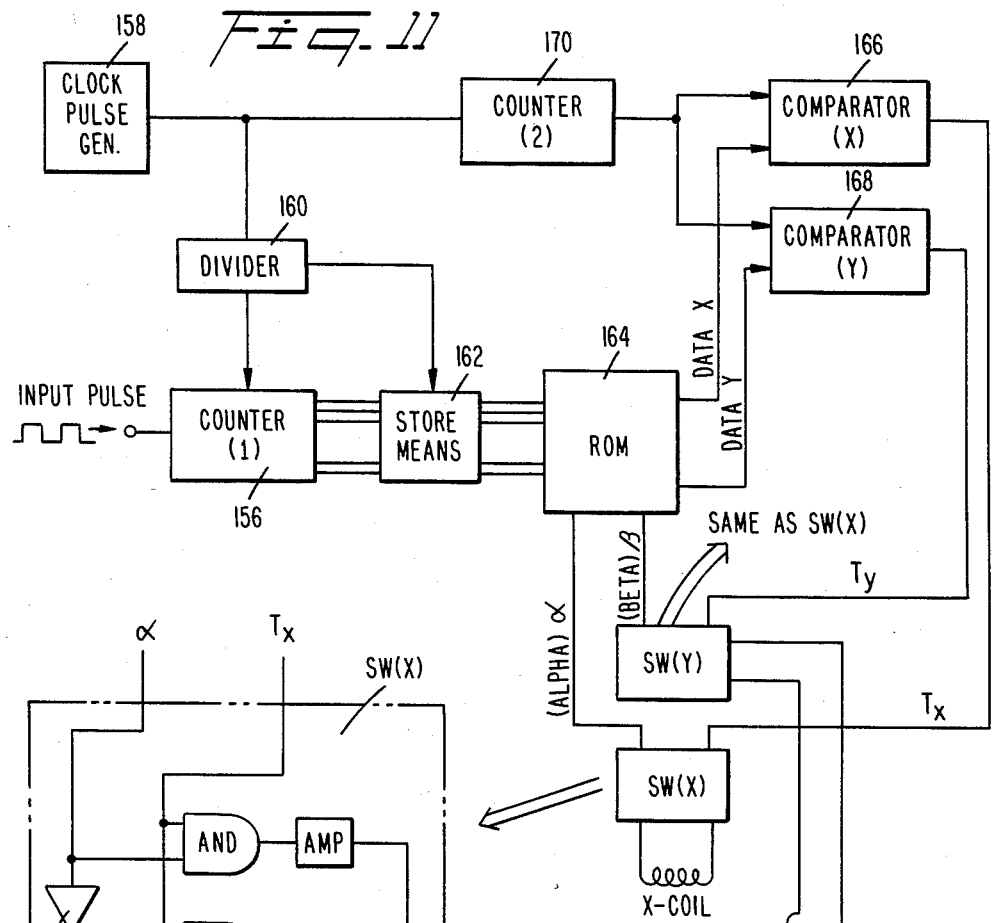
Fig. 11
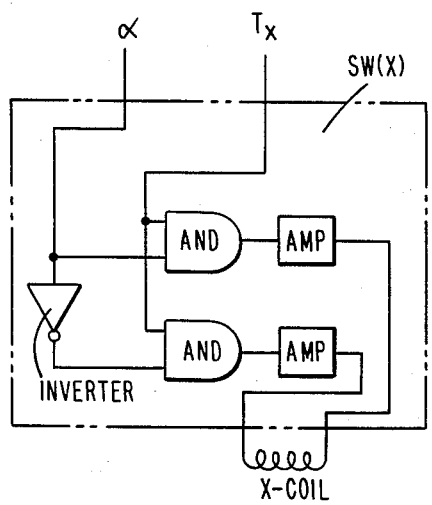
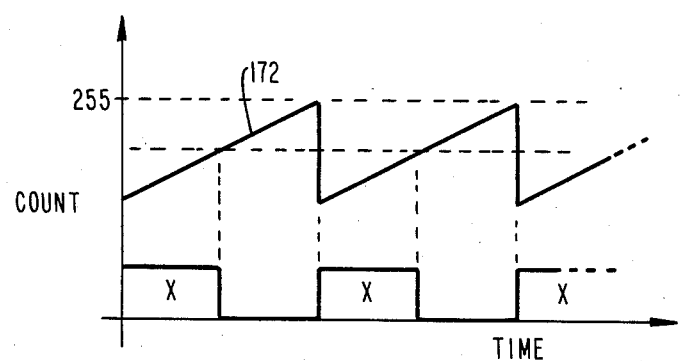
Fig. 12

| ANGLE | SUPPLY DIRECTION SIGNAL LINE | LEVEL | COIL TERMINAL | LEVEL | COMPOSITE MAGNETIC FIELD DIRECTION |
|---|---|---|---|---|---|
| 0° ⟨ | α | H | X₁ | H | 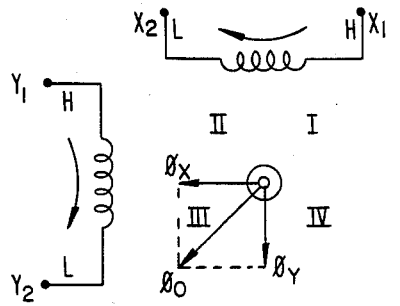 |
| | | | X₂ | L | |
| 90° | β | H | Y₁ | H | |
| | | | Y₂ | L | |
| 90° ⟨ | α | H | X₁ | H | 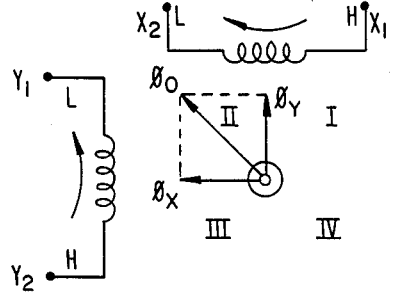 |
| | | | X₂ | L | |
| 180° | β | L | Y₁ | L | |
| | | | Y₂ | H | |
| 180° ⟨ | α | L | X₁ | L | 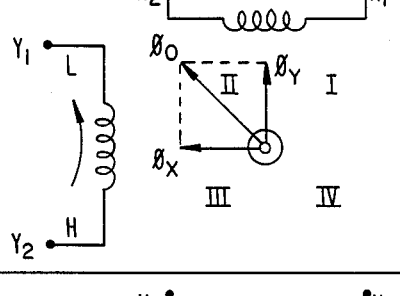 |
| | | | X₂ | H | |
| 270° | β | L | Y₁ | L | |
| | | | Y₂ | H | |
| 270° ⟨ | α | L | X₁ | L | 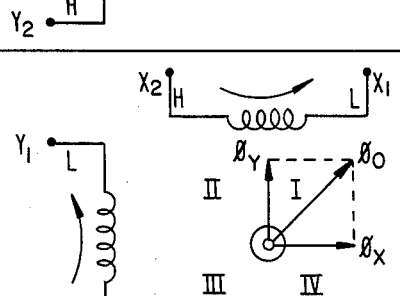 |
| | | | X₂ | H | |
| 360° | β | H | Y₁ | H | |
| | | | Y₂ | L | |
Fig. 13

INSTRUMENT WITH CROSSED-COIL TYPE MOVABLE MAGNET

BACKGROUND OF THE INVENTION

1. Field of the Invention

The present invention relates to a general purpose instrument with a cross-coil type movable magnet to be used, for example, in a fuel meter or a thermometer of a vehicle.

2. Description of Prior Art

In an instrument with a cross-coil type movable magnet including a pointer needle shaft, a movable magnet rotating about the pointer needle shaft is located in a bobbin, and crossed coils crossing each other are wound on the bobbin so that a measured value or the like obtained from an object to be measured is converted into an electric s signal and a current corresponding to the electric current is applied to the crossed coils. This causes magnetic fields to be generated, and the movable magnet is rotated in a direction of the composite magnetic field of the crossed coils, which turns the pointer needle shaft to point to a measured value.

If electric current flow direction through each of the crossed coils is variable, the direction of the composite magnetic field can be arranged with any angle through an arc of 360°. In practice, however, when the instrument is mounted on a vehicle or the like, the directions of application of electric currents to the crossed coils are fixed because a direct-current (DC) power supply, such as a secondary cell or an accumulator, is used as the power supply for the instrument, which limits the range of rotation of the pointer needle shaft to the range of the crossing angle between the crossed coils. To overcome this difficulty, there have been proposed various methods to improve the instrument with a crossed-coil type movable magnet to provide an indication through a wider angle.

One of the proposals is described in Japanese Patent Laid-Open No. 46-6091 in which by use of means for converting an input from a measurement object into a DC signal and for inverting a DC signal exceeding a predetermined value, one of the crossed coils is supplied with an output current that develops one cycle of a substantially sinusoidal signal and the other of the crossed coils is supplied with an output current that develops one cycle of a substantially cosinusoidal signal, as the input quantity increases from the minimum value to the maximum value.

In addition, as described in Japanese Patent Laid-Open No. 50-34255, there exists a method in which an input signal is received and is supplied to a plurality of pulse generators, which generate a plurality of pulse signals to be used to control a switch means disposed between the pulse generators and the crossed coils.

Moreover, in a method described in Japanese Patent Laid-Open No. 51-131357, the crossed coil unit does not comprise two coils crossing each other at a right angle therebetween but includes three coils in respective directions, and an electric signal corresponding to the input quantity is supplied by the use of two adjacent coils as a pair.

The prior art examples described above are respectively attended with disadvantages. Namely, in the method using the means to invert the DC signal and to supply a substantially sinusoidal signal and a substantially cosinusoidal signal to the respective crossed coils, since current having a characteristic of a direct current is supplied, power loss takes place at an output section, which leads to heat generation. Moreover, since e the output characteristic of the pointer needle shaft is fixed, it is difficult to select a display dial or scale e plate most suitable of r an instrument to be adopted.

Furthermore, in the method in which an input is converted into a plurality of pulse signals and the crossed coils are supplied with pulse signals undergoing switch control, since the current flows through the coils intermittently, the pointer needle shaft undesirably oscillates when the input quantity is small.

Next, in the method using three crossed coils, the manufacturing process of the coils is much h more complicated as compared with two crossed coils and hence the cost soars.

SUMMARY OF THE INVENTION

According to the present invention, a wide-angle indicating function is provided in a movable-magnet-type instrument including two crossed coils crossing each other at a right angle together with novel circuitry for driving the coils, thereby solving the disadvantages of the prior art method. The instrument magnet includes two crossed coils in which a movable magnet rotating about a pointer needle is disposed so as to indicate a measured quantity or the like by supplying an electric current to each crossed coil. Upon receiving an input from an object to be measured, flow direction and time are set for each crossed coil determined, in one embodiment, by predetermined arithmetic processing and, in another embodiment, by read only memory (ROM) table look-up. A pulse signal of a predetermined potential is input to each crossed coil under the conditions thus set.

Consequently, referring now to a simplified diagram of FIG. 1, when an input quantity is received, current flow direction current is determined for each of coils X and Y according to the magnitude of the input quantity. For example, a direction a→b and a direction c→d are respectively determined for the coils X and Y, and the time for supplying the current is also determined for each of the coils X and Y in accordance with the magnitude of the input quantity. When pulse signals with predetermined potential values flow through the coils X and Y for respective predetermined periods of time, the movable magnet turns in the direction of the composite magnetic field $\Phi_O$ resultant from the magnetic fields $\Phi_X$ and $\Phi_Y$ generated by the coils X and Y, respectively. This enables the pointer needle to indicate the input quantity, namely, information associated with the measurement object. Moreover, as the input quantity changes and the directions for supplying the currents become different from those described above, for example when the direction for supplying the electric current to the coil X is set to the direction b→a, the direction of the magnetic field $\Phi'_X$ generated by the coil X becomes opposite to that of the magnetic field $\Phi_X$ generated in the preceding condition and the position to which the pointer needle points is determined by both current flow directions and time durations in each coil.

Thus, with the provision of an instrument driving mechanism in which the directions for supplying the currents to the coils X and Y can be set according to the input quantity, there is provided a moving-magnetic-type instrument capable of effecting a 360° indication by controlling both the duration and direction of current applied to each coil of a cross-coil unit. In addition, according to the present invention, since a DC pulse signal set independently of the input quantity is applied to the coils, the circuit develops almost no electric loss and heat generation is prevented so that the circuit can be miniaturized. Moreover, disadvantages such as oscillation of the pointer needle in response to a low input quantity cannot take place.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

The present invention will be apparent from the following detailed description taken in conjunction with the accompanying drawings in which:

FIG. 4 is a flow chart broadly describing the operation of the arithmetic processor of FIG. 3;

FIG. 5 is a flow chart describing an alternative to FIG. 4 wherein the period of input pulses is determined to obtain the value of an input parameter being measured;

FIG. 6(a) and FIG. 6(b) show gating and clock pulse waveforms, respectively, to help describe an alternative method of measuring an input parameter;

FIG. 11 is a block diagram of a circuit employing a read only memory (ROM) for driving the crossed-coils in accordance with a second preferred embodiment of the invention;

FIG. 12 is a graph of current pulses having controlled durations established by the circuit of FIG. 11; and FIG. 13 is a table showing how composite magnetic flux and coil current flow directions are related.

BEST MODE FOR PRACTICING THE INVENTION

Figure 1:
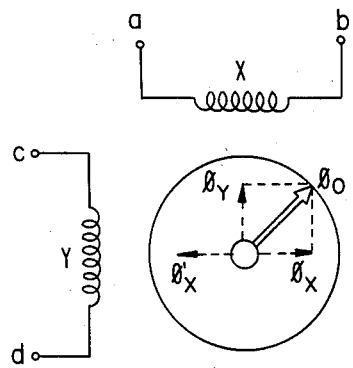
FIG. 1 is an explanatory diagram illustrating operations of an instrument with a crossed-coil movable magnet of a type to which the invention is directed.
Figure 2:
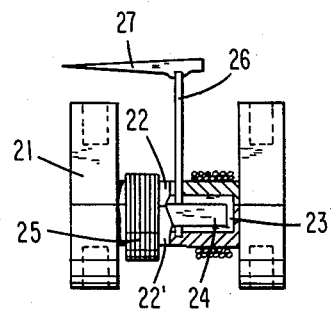
FIG. 2 is a front view of a portion of the instrument showing the instrument movement.

Referring to FIG. 2, a pointer movement of a type to which the invention is applied, comprises a upper frame 22 and a lower frame 22' disposed with a mounting base 21 at each of four corners thereof, combined to form a bobbin, 23. A movable magnet 24 is installed in the bobbin 23 so as to be arbitrarily rotatable therein Crossed-coil unit 25, comprising a coil X and a coil Y (FIG. 1) is wound on external surfaces of frames 22-22'. A pointer needle shaft 26 is separately linked to the movable magnet 24, with the shaft 26 being disposed to extend from the upper frame 22. A pointer needle 27 is mounted on the shaft 26.

In accordance with the preferred embodiments of this invention, the coils X and Y of crossed-coil unit 25 are driven selectively with currents having controllable flow directions and durations, responsive to an input parameter being measured, to rotate movable magnet 24, shaft 26 and pointer needle 27 throughout a 360° arc of rotation.

Figure 3:
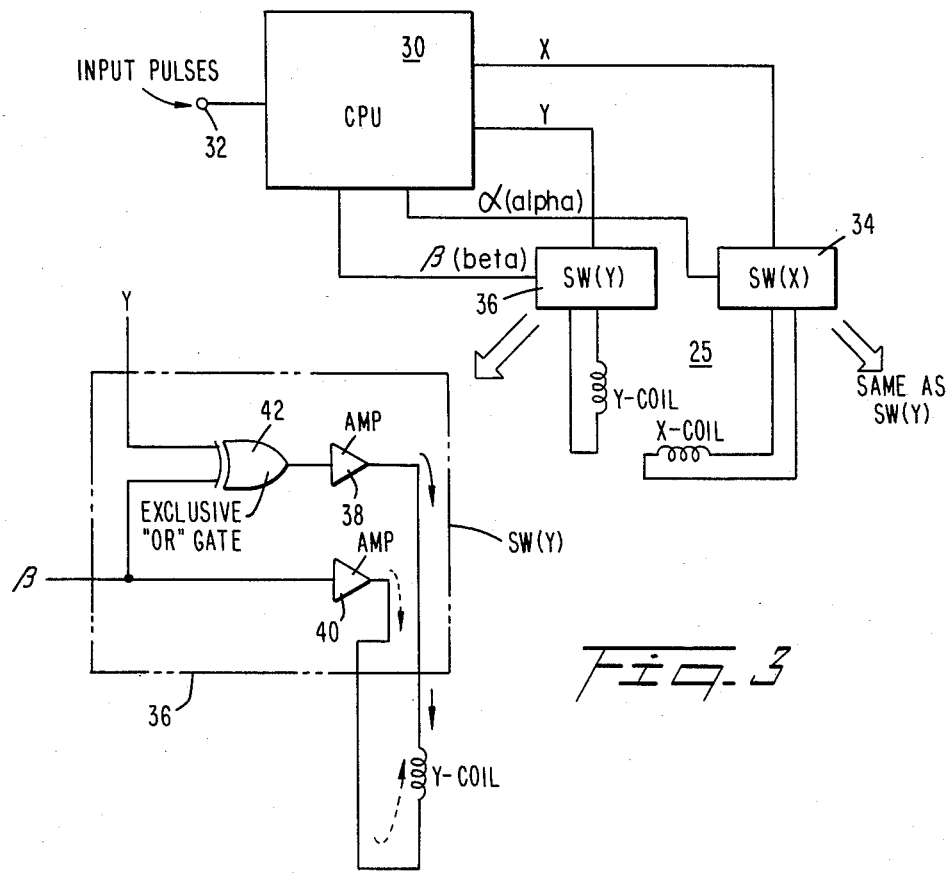
FIG. 3 is a schematic block diagram of circuitry for driving the crossed-coils using an arithmetic processor unit in accordance with one preferred embodiment of the invention with coil d driving switches shown in symbolic form.

In a first preferred embodiment of the invention, shown in FIG. 3, coils X and Y of the crossed-coil unit 25 are driven by current pulses through switches 34 and 36 that are controlled respectively by a sinusoidal and a cosinusoidal waveform developed by an arithmetic processor 30 in response to an input parameter in the form of input pulses at input terminal 32. The input pulses have a pulse repetition rate corresponding to the magnitude of the input parameter. In this example, it will be assumed that the input pulses are generated by a tachometer and are representative of engine speed, although it will be apparent that any other type of input parameter could be measured as well in accordance with the principles of this invention.

The processor 30 is programmed to apply sinusoidal and cosinusoidal control currents to switches SW(X) and SW(Y), identified by 34, 36 in FIG. 3, to in turn apply current pulses to coil X and coil Y of crossed-coil unit 25. Based upon the magnitude of the input parameter, the directions of current flow in the two coils establish the quadrant of arc within which the needle pointer swings, and the frequency or period of the current applied to the two coils determines the location of the pointer within each quadrant.

The directions of current flow in the two coils X and Y of the crossed-coil 25 are determined by the states of output lines alpha and beta of arithmetic processor 30. For example, with reference to FIG. 13, to position pointer needle 27 into quadrant III of the output of the instrument, representing an arc of rotation of needle pointer 27 within the range of 180° and 270°, current is controlled to flow from terminal $X_1$ to terminal $X_2$ of coil X and from terminal $Y_1$ to terminal $Y_2$ of coil Y. This is carried out by switches 34 and 36 in response to logic high states at processor output lines alpha and beta. Similarly, the needle pointer 27 is positioned within quadrants I, II and IV by applying currents to coils X and Y in the directions shown in FIG. 13 in response to the logic states of the lines alpha and beta.

The direction of current flow in each coil is controlled by switches 34, 36 as follows with reference to FIG. 3 showing switch 36 in a symbolic form. Considering for this example coil Y, when a logic high state on line beta is applied to switch 36, current flows via amplifier 38 through the coil Y in the direction shown by the solid arrow in FIG. 3, and alternatively, when line beta is at a logic low state, the switch 36 applies via amplifier 40 a driving current through coil Y in the opposite direction, indicated by dashed arrows. Similarly, although not shown, the logic state of line alpha applied to switch 34, controls current flow direction in coil X.

The directions of flow of current in the coils X and Y establish the quadrant within which needle pointer 27 is moved, as described, and the position of the pointer within the quadrant, determined by the duration of current flow in the coils, is controlled by the logic state of processor output lines X, Y which correspond respectively to the coils X, Y of crossed-coil unit 25.

The amplifiers 38, 40 are controlled by an Exclusive OR gate 42 having one input connected to current flow direction control line alpha or beta and the other input connected to time duration control line X or Y. An Exclusive OR circuit by definition has an output that is at a logic high state only if the logic states of the input terminals of the gate are different from each other. Accordingly, current in each coil X, Y having flow in either direction flows only for a time duration determined by the logic state on line X or line Y. For example, when line beta is at a logic high state and line Y is at a logic low state, the output of gate 42 is at a logic high state since the input states are different from each other, and current in coil X flows in the direction of the solid arrow. However, when the state of line Y changes to a logic high state, because the input logic states are now the same, the output of the gate 42 switches to a logic low state to terminate current flow in coil Y. The duration of current flow in coil Y is therefore controlled by the state of the processor output line Y. Similar commentary applies to processor output lines alpha and X and switch 24 to control the direction and duration of current flow in coil X.

In accordance with the embodiment of FIG. 3, the durations of current flow in coils X and Y controlled by processor output lines X and Y and switches 34, 36 are established by the period of sinusoidal and cosinusoidal waveforms developed by the arithmetic processor 30 in response to the magnitude of the input parameter being measured. Thus, with reference to FIG. 4, processor 30 is programmed to carry out the sequence of functions set forth broadly in the flow chart therein, wherein following initiation of power to the instrument (step 44), the input parameter is measured by determining the period of pulses received in input terminal 32 (step 46) and carrying out an arithmetic process (step 48) to develop sinusoidal and cosinusoidal control waveforms having periods corresponding to the measured input parameter. Currents corresponding to the sinusoidal and cosinusoidal waveforms are applied through switches 34, 36 to the coils X and Y (step 50), and when power is subsequently removed (step 52), a conventional shutdown sequence (step 54) is carried out to ready the instrument to be again turned on (step 56).

Step 46, shown in detail in the flow chart of FIG. 5, measures the period between successive pulses to determine, indirectly, the input pulse repetition rate. The routine described in FIG. 5, upon execution (step 58), monitors the state of the input terminal 32 to detect the presence of a pulse. When the input terminal 32 has a logic high state, indicating the presence of a pulse, a counter, implemented by software in CPU 30, increments at the system clock rate (step 62). When input terminal 32 switches to a logic low state, indicating that no pulse currently is at the input terminal, the counter increments (step 64). In step 66, with the input terminal still at a logic low state the counter continues to increment, at the system clock rate (step 68), until the state of input terminal 32 returns to a logic high state, indicating completion of an input pulse cycle. The accumulated count is stored (step 70), and the counter, is reset (step 72). The stored count represents the period of the input pulses, to be applied to synthesize sinusoidal and cosinusoidal waveforms in the arithmetic processor 30.

It should be recognized that the frequency, rather than the period, of the input pulses can alternatively be measured, for processing by processor 30 to develop the required sinusoidal and cosinusoidal waveforms to control switches 34 and 36 to in turn apply current to drive coils X and Y. Thus, with reference to FIGS. 6(a) and 6(b), the processor 30 may, if desired, be programmed to establish fixed gating periods, shown in FIG. 6(a), within which the input pulses are counted. In this example, although not shown, a counter responsive to pulses at input terminal 32 is controlled by gating the counter on and off using the fixed duration signals of FIG. 6(a), determined arbitrarily.

Figure 7:
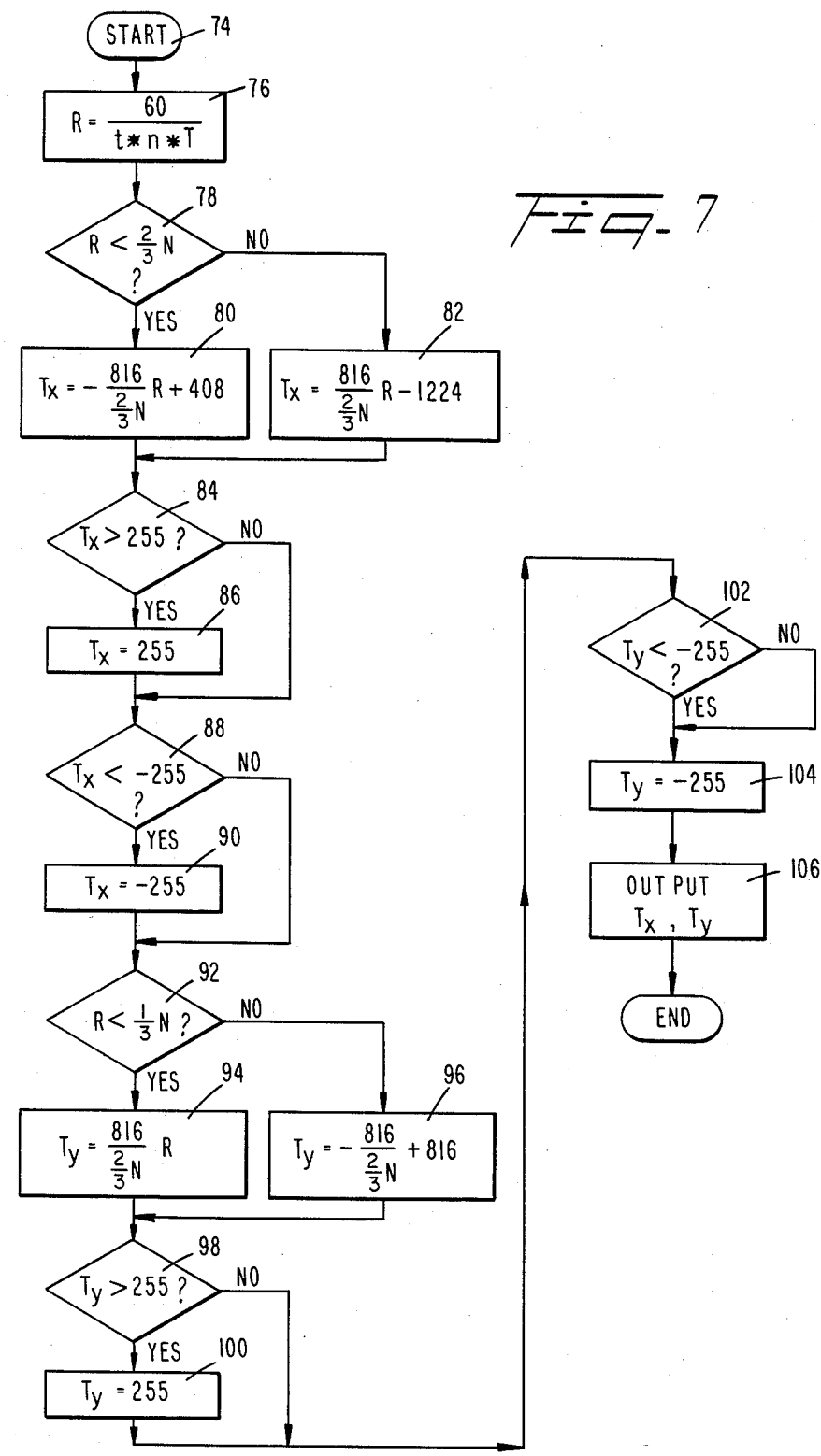
FIG. 7 is a detailed flow chart showing how the arithmetic processor of FIG. 3 generates sinusoidal and cosinusoidal waveforms in the form of piecewise linear approximations, to drive the crossed-coils.
Figure 8:
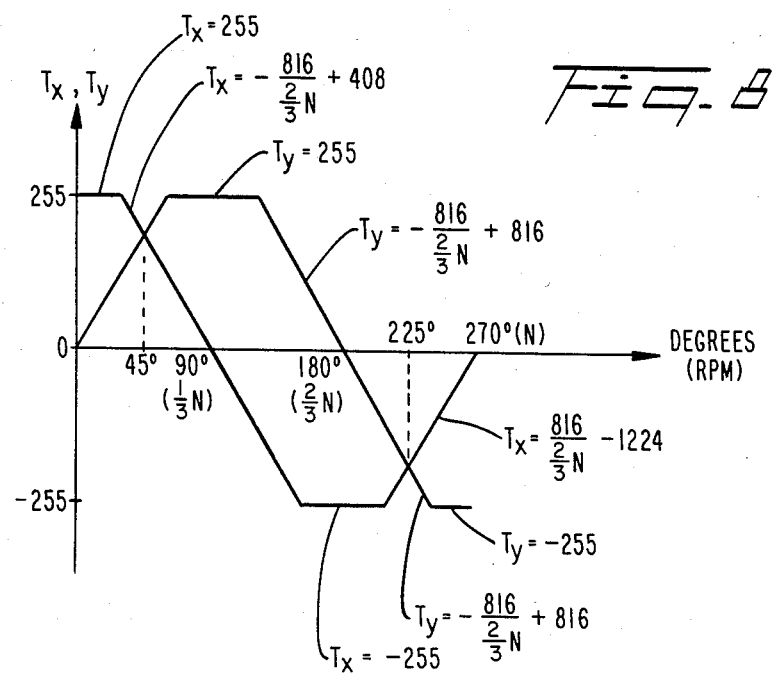
FIG. 8 is a diagram of piecewise linear approximations of sinusoidal and cosinusoidal waveforms developed in accordance with the flow chart of FIG. 7.

With reference to FIG. 7, an algorithm carried out by the flow chart shown therein synthesizes the sinusoidal and cosinusoidal control waveforms of FIG. 8, wherein the waveforms are piecewise linear approximations of sinusoidal and cosinusoidal waveforms. In the flow chart of FIG. 7 and wave forms of FIG. 8, the symbols are identified as follows:

t: system clock time period
n: number of pulses generated per each revolution of an engine, e.g. n=2 in a four cycle, four cylinder engine.
R: number of engine revolutions (RPM)
T: pulse period developed by flow chart of FIG. 6
Tx: time duration of current applied to coil X
Ty: time duration of current applied to coil Y
N: speed of engine, in RPM, when the needle pointer is at full scale, e.g. 270°

Thus, with more detailed attention to FIGS. 7 and 8, upon execution of the routine shown in FIG. 7 (step 74), the number of engine revolutions R is calculated as a function of the number of pulses per revolution of the engine, n, the measured pulse period T and the system clock period t (step 76). If the number of engine revolutions per minute (RPM) calculated in step 76 is less than two-thirds full scale (step 78), the processor 30 develops a line segment defined by step 80 (see also FIG. 8) having a negative slope; if engine RPM is greater than two-thirds full range RPM, on the other hand, the processor 30 develops a line segment defined by step 82 and having a positive slope, shown in FIG. 8. Steps 84, 86, 88 and 90 clamp the sinusoidal waveform to peak values of 255 and −255, shown in FIG. 8 to complete a synthesized sinusoidal waveform. The quantity 255 is selected for convenience, i.e., it represents the decimal value of the capacity of an eight bit converter.

Similarly, steps 92, 94, 96, 98, 100, 102 and 104 develop the piecewise linear approximation of a cosinusoidal waveform, as shown in FIG. 8, clamped between the upper and lower limits defined by the quantity (absolute value) 255.

The constants which define the amplitude and slopes defining the piecewise linear sinusoidal and cosinusoidal waveforms of FIG. 8 a redetermined arbitrarily in accordance with particular circuit and parametric requirements in this example; however, appropriate constants will be developed by persons skilled in the art depending upon applicable circuit and parametric requirements. The sinusoidal and cosinusoidal waveforms thus developed are made available as control signals Tx and Ty, respectively, in step 106.

Figure 9:
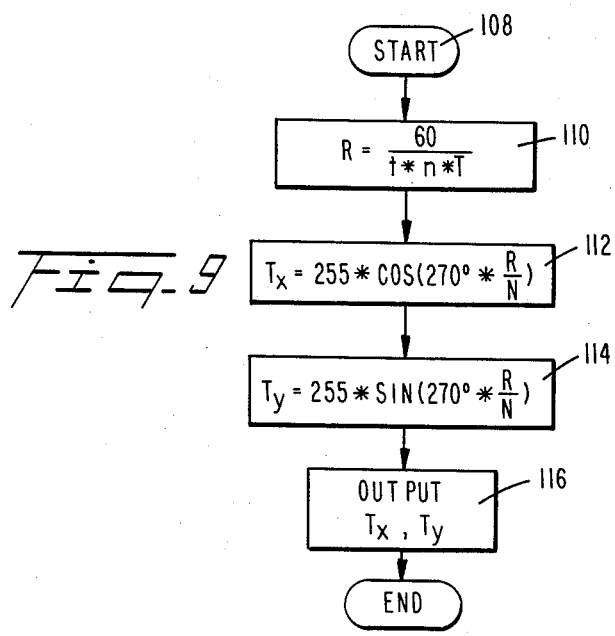
FIG. 9, is a flow chart showing how the arithmetic processor of FIG. 3 develops sinusoidal and cosinusoidal waveforms using linear, rather than piecewise linear, processing.

Alternatively, the arithmetic processor 30 may be programmed to develop pure sinusoidal and cosinusoidal wave forms, i.e., without undergoing calculation of piecewise linear approximations. Thus, with reference to FIG. 9, an alternative routine may be executed at step 108 to measure engine RPM R (step 110) in a similar manner as carried out in step 76. Steps 112 and 114 compute the sinusoidal and cosinusoidal waveforms by computing values of the respective trigonometric functions, to be made available as an output signal (step 116) to drive coils X and Y.

Figure 10:
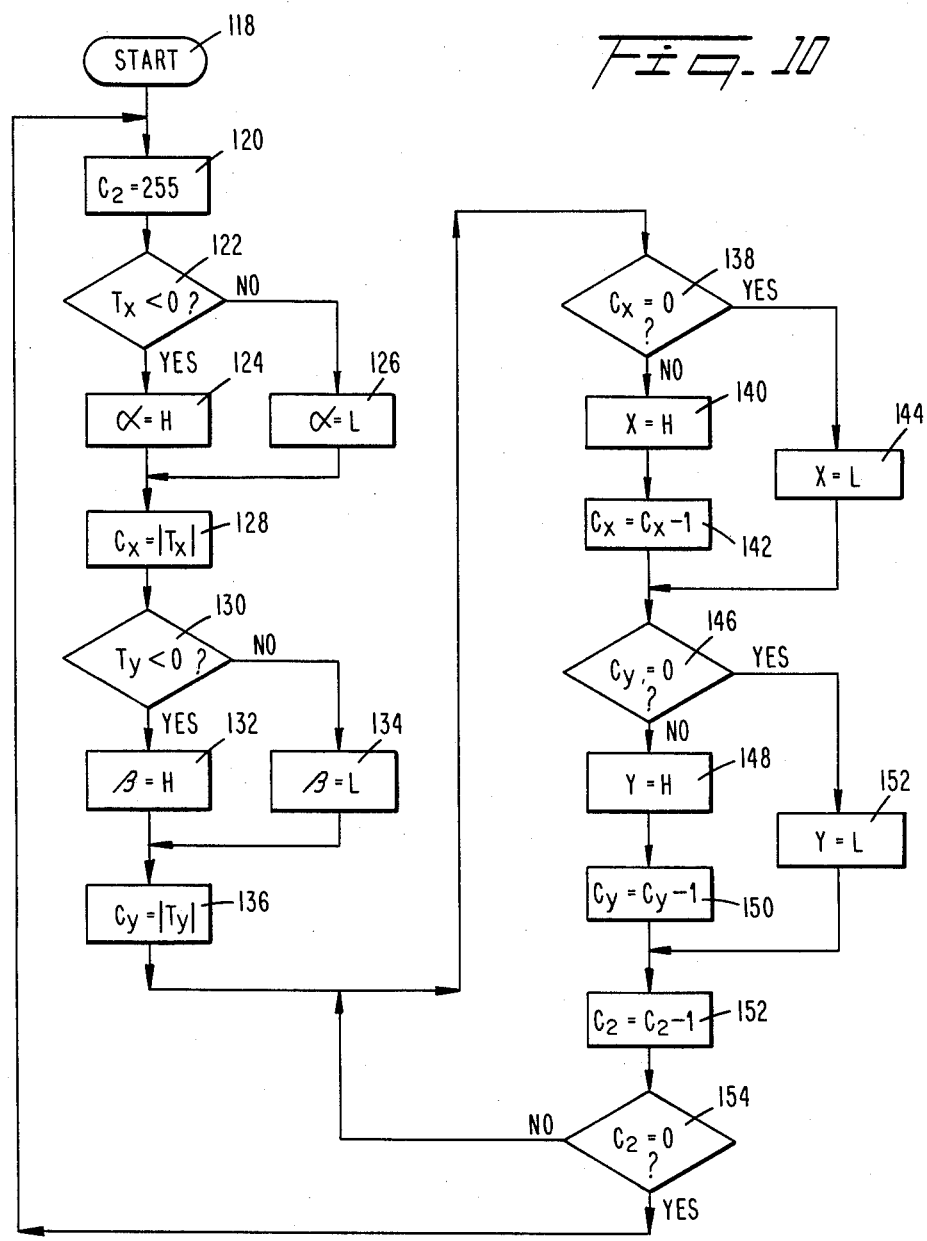
FIG. 10 is a flow chart showing how the arithmetic processor of FIG. 3 drives the crossed-coils as a function of the input parameter being measured.

In either case, the output routine 50 of FIG. 4 is provided by the routine shown in FIG. 10, wherein, upon execution (s step 118), a counter r is present t to 255 corresponding to the maximum value of an 8 bit binary counter (step 120). If the value of Tx is less than zero, the processor output line alpha is set at a logic high state; otherwise, the line is set at a logic low state (steps 122, 124, 126). Another counter Cx is preset at the magnitude of Tx determined in FIG. 7 or in FIG. 9 (step 128).

If the value of current Ty to be applied to coil Y is less than zero (step 130), the processor output line beta is set at a logic high state (step 132); otherwise, the line is set to a logic ow state (step 134). A counter Cy is now set to the value of current Ty to be applied to coil Y (step 136).

Assuming that the count in counter Cx is not zero (step 138), the current direction control line X is set at a logic high state (step 140) and the count in counter Cx is decremented (step 142). If the content of the counter Cx (step 138) is zero, on the other hand, the control line X is set at a logic low state (step 144).

Similarly, assuming that the count of counter Cy is not zero (step 144), the flow direction control line Y, for controlling the direction of current flow in coil Y, is set at a logic high state (step 148) and the count of counter Cy is decremented (step 150). On the other hand, if the content of counter Cy is not zero, in step 146, the current flow direction flow line Y is set at a logic low state (step 152).

The content of counter $C_2$ is decremented (step 152) and if the counter has not yet counted down to zero (step 154), steps 138–154 are repeated; otherwise, the program returns to step 120.

Thus, the direction of current flow in each coil is established by testing the polarities of currents to be applied to coils X and Y during successive fixed periods consisting of 255 system clock counts preset in step 120. During each such period, the states of lines X and Y are controlled to energize the two coils X and Y for time durations determined by the piecewise linear or pure sinusoidal waveforms obtained in FIGS. 7 and 9.

In accordance with a second embodiment of the invention, coils X and Y of crossed-coils 25 are energized by data prestored in a read only memory (ROM) defining current flow directions and durations that correspond to the magnitude of the input parameter. No arithmetic processing in this embodiment accordingly is required.

Thus, with reference to FIG. 11, the period of the input pulse is computed by counter 156 in the manner shown in FIGS. 6(a) and 6(b) by controlling the counter to count input pulses only during predetermined fixed durations derived from clock pulse generator 158 and divider 160. The count stored in first counter 156 will thus correspond to the frequency of the input pulses, and accordingly, engine speed in this example, to be stored in a memory 162. The content of memory 162 is used to address a ROM 164 which is preprogrammed with data defining the directions and durations of current to be applied to coils X and Y.

Thus, as one example, ROM 164 may contain at least 200 pieces of data, each addressable by memory 162 and containing the states of the current direction control lines alpha and beta and the current duration control lines X and Y. The ROM 154 thus is programmed to apply a logic high signal or a logic low signal on each of the two lines alpha and beta to control the directions of current in coils X and Y, in accordance with Table 13, and each storage location of the ROM 154 also contains a digital multiple bit word corresponding to the duration of current to be applied to the respective coil X, Y.

The digital values stored in ROM 164 are converted to time durations by applying the values to one input of a first comparator 166 and of a second comparator 168 corresponding, respectively, to coi X and coi Y of the crossed-coil 25. The remaining inputs of comparators 166 and 168 are connected to the output of a second counter 170 that is driven by clock pulse generator 158. The counter 170 is of a recirculating type, repeating at a period corresponding to the number of bits of the counter and the repetition rate of the generator 158. For example, with reference to FIG. 12, as eight bit counter 170 accumulates counts from generator 158 repetitively, the content of the counter as a function of time is described by a sawtooth waveform 172 having a peak value of 255 count. As the digital value of the output of counter 170 intersects the corresponding output of ROM 164, the corresponding comparator generates an output signal defining the end of the current flow duration of the respective coil.

For example, assuming that divider 160 generates output pulses spaced apart by 0.3532 second, to establish the gating period of counter 156, and assuming further that 16 pulses are generated by the tachometer for each revolution of the engine, the frequency of the input pulses is defined by:

$$f = 16 * V * 637/60 * (1/60);$$

and the number of pulses, M, accumulated by second counter 156 is defined by:

$$M = T * 16 * V(637/3600) = (10192/3600) * t * V$$

Engine speed, V, in RPM is defined as follows:

$$V = (3600/10192) * (M/T) = 0.3532 * (M/T).$$

Accordingly, if the gate time, T, is selected as 0.3532, the number of pulses per gate period is equal to engine speed in RPM, without any need for numerical conversion.

There has accordingly been described embodiments of a method and apparatus for increasing the range of the pointer needle of a crossed-coil instrument movement, wherein both the duration and direction of current applied to each coi of the crossed-coil unit are controlled as a function of an input parameter, e.g., engine speed, measured from a measurement object, e.g. engine tachometer. The composite flux developed by the flux generated by each coil as a result of currents applied thereto, in accordance with the invention, drives the pointer needle through a substantially wider range than heretofore possible.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

We claim:

1. A crossed-coil type instrument having a needle shaft rotated by a movable magnet shaft within a crossed-coil unit for measuring an input electrical parameter to be measured from a measurement object, comprising:
   input means for receiving said electrical parameter;
   settling means including an arithmetic processor for carrying out arithmetic computations based upon said electrical parameter to set current flow directions and time durations associated with said electrical parameter;
   means for generating control current pulses having a predetermined constant magnitude and directions and time durations determined by said setting means;
   output means responsive to said generating means for applying output current pulses to said crossed-coil unit;
   clock means for generating clock pulses having a fixed repetition rate; and
   counter means for counting said clock pulses generated by said clock means during a time duration corresponding to said electrical parameter.

2. A crossed-coil type instrument having a needle shaft rotated by a movable magnet shaft within a crossed-coil unit for measuring an input electrical parameter to be measured from a measurement object, comprising:
   input means for receiving said electrical parameter;
   means for setting current flow directions and time durations associated with said electrical parameter;
   means for generating control current pulses having a predetermined constant magnitude and directions and time durations determined by said setting means;
   output means responsive to said generating means for applying output current pulses to said crossed-coil unit;
   wherein said setting means comprises a read only memory (ROM) having stored therein current flow direction and time duration data;
   clock means for generating clock pulses having a fixed repetition rate;
   counter means for counting said clock pulses generated by said clock means during a time duration corresponding to said electrical parameter; and
   comparator means responsive to outputs of said counter means and said ROM for generating said control current pulses.

3. In a crossed-coil type instrument having a needle shaft rotated by a movable magnet shaft within a crossed-coil unit for measuring an input electrical parameter to be measured from a measurement object, a method of driving the needle shaft in accordance with the input electrical parameter, comprising the steps of:
   measuring a characteristic of said electrical parameter;
   setting current flow directions and time durations associated with said electrical parameter by calculating, arithmetically, based upon said electrical parameter characteristic, control current flow directions and time durations, said calculating including making piecewise linear approximation computations;
   generating control current pulses having a predetermined constant magnitude directions and time durations determined by said setting means; and
   applying output current pulses to said crossed-coil unit based upon said control current pulses.

4. In a crossed-coil type instrument having a needle shaft rotated by a movable magnet shaft within a crossed-coil unit for measuring an input electrical paramenter to be measured from a measurement object, a method of driving the needle shaft in accordance with the input electrical parameter, comprising the steps of:
   measuring a characteristic of said electrical parameter;
   setting current flow directions and time durations associated with said electrical parameter by calculating, arithmetically, based upon said electrical parameter characteristic, control current flow directions and time durations, said calculating including making sinusoidal computations;
   generating control current pulses having a predetermined constant magnitude and directions and time durations determined by said setting means; and
   applying output current pulses to said crossed-coil unit based upon said control current pulses.

5. In a crossed-coil type instrument having a needle shaft rotated by movable magnet within a crossed-coil unit for measuring an input electrical parameter to be measured from a measurement object, means for receiving the electrical parameter;
   coil driving means responsive to said electrical parameter for applying an output pulse current to said crossed-coil unit, said coil driving means including an arithmetic processor means for generating a sinusoidal control current as a function of said input electrical parameter, means for generating said output pulse current in response to said control current and means for applying said output pulse current to said crossed-coil unit.

6. The instrument of claim 5, wherein said sinusoidal current generated by said processor means is a piecewise linear approximation of a sinusoidal current.

* * * * *